(12) United States Patent
Li et al.

(10) Patent No.: US 11,963,434 B2
(45) Date of Patent: Apr. 16, 2024

(54) FLEXIBLE BASE SUBSTRATE, DISPLAY PANEL AND DISPLAY DEVICE

(71) Applicant: BOE Technology Group Co., Ltd., Beijing (CN)

(72) Inventors: Xiaohu Li, Beijing (CN); Zhiqiang Jiao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 436 days.

(21) Appl. No.: 17/414,461

(22) PCT Filed: Dec. 29, 2020

(86) PCT No.: PCT/CN2020/140895
§ 371 (c)(1),
(2) Date: Jun. 16, 2021

(87) PCT Pub. No.: WO2021/147627
PCT Pub. Date: Jul. 29, 2021

(65) Prior Publication Data
US 2022/0310946 A1    Sep. 29, 2022

(30) Foreign Application Priority Data

Jan. 22, 2020    (CN) .......................... 202010075997.2

(51) Int. Cl.
*H10K 77/10*    (2023.01)
*H10K 59/12*    (2023.01)
(Continued)

(52) U.S. Cl.
CPC ............ *H10K 77/111* (2023.02); *H10K 59/12* (2023.02); *H10K 50/8445* (2023.02); *H10K 71/00* (2023.02); *H10K 2102/311* (2023.02)

(58) Field of Classification Search
CPC ................. H10K 77/111; H10K 59/12; H10K 2102/311; H10K 71/00; H10K 50/8445
See application file for complete search history.

(56) References Cited

U.S. PATENT DOCUMENTS

2015/0102324 A1    4/2015 Lee
2016/0351852 A1*   12/2016 Kim .................. H10K 50/8445

FOREIGN PATENT DOCUMENTS

CN    105702624 A    6/2016
CN    106847832 A    6/2017
(Continued)

OTHER PUBLICATIONS

The First Office Action dated Jun. 27, 2022 corresponding to Chinese application No. 202010075997.2.

*Primary Examiner* — Patricia D Valenzuela
(74) *Attorney, Agent, or Firm* — Nath, Goldberg & Meyer; Joshua B. Goldberg

(57) ABSTRACT

The present disclosure provides a flexible base substrate, a display panel and a display device, and belongs to the field of display technologies. The flexible base substrate includes at least one substrate unit each having a middle region and an edge region; wherein the flexible base substrate includes: a first flexible layer, a second flexible layer, and an isolation layer disposed between the first flexible layer and the second flexible layer; the isolation layer includes a first surface in contact with the first flexible layer, and a second surface in contact with the second flexible layer; and wherein at least one of the first surface and the second surface has a segment difference on two sides of a junction between the middle region and the edge region.

7 Claims, 3 Drawing Sheets

(51) Int. Cl.
  *H10K 50/844*   (2023.01)
  *H10K 71/00*    (2023.01)
  *H10K 102/00*   (2023.01)

(56) References Cited

FOREIGN PATENT DOCUMENTS

| CN | 107968152 A |   | 4/2018  |
|----|-------------|---|---------|
| CN | 108281388 A |   | 7/2018  |
| CN | 108666347 A |   | 10/2018 |
| CN | 109378325 A |   | 2/2019  |
| CN | 109755409   | * | 5/2019  |
| CN | 109755409 A |   | 5/2019  |
| CN | 110047995 A |   | 7/2019  |
| CN | 110571348 A |   | 12/2019 |
| CN | 111146342 A |   | 5/2020  |

\* cited by examiner

FLEXIBLE BASE SUBSTRATE, DISPLAY PANEL AND DISPLAY DEVICE

This is a National Phase Application filed under 35 U.S.C. 371 as a national stage of PCT/CN2020/140895, filed Dec. 29, 2020, an application claiming the benefit of Chinese Application No. 202010075997.2, filed Jan. 22, 2020, the content of each of which is hereby incorporated by reference in its entirety.

TECHNICAL FIELD

The present disclosure belongs to the field of display technologies, and particularly relates to a flexible base substrate, a display panel and a display device.

BACKGROUND

The base substrate used in flexible products generally includes a first flexible layer, a second flexible layer and an isolation layer sandwiched between the first flexible layer and the second flexible layer; wherein the isolation layer is configured to isolate water and harmful gases such as oxygen, so as to prevent the subsequent film layers formed on the substrate from being damaged. However, after the display device is packaged, when the substrate is cut by a laser cutting process, and when the flexible product is bent, the isolation layer may be easily damaged to generate a crack, causing water and harmful gases such as oxygen to permeate into the light-emitting device along the crack of the isolation layer, and thus damaging the light-emitting devices.

SUMMARY

To solve at least one of the problems in the related art, the present disclosure provides a flexible base substrate, a display panel and a display device.

In a first aspect, an embodiment of the present disclosure provides a flexible base substrate, including a first flexible layer, a second flexible layer, and an isolation layer disposed between the first flexible layer and the second flexible layer; the isolation layer includes a first surface in contact with the first flexible layer, and a second surface in contact with the second flexible layer; and at least one of the first surface and the second surface has a segment difference on two sides of a junction between the middle region and the edge region.

The isolation layer has a segment difference at the junction between the middle region and the edge region.

Each of the first surface and the second surface of the isolation layer is a concave-convex surface, and a concave part of the second surface is embedded in a concave part of the first surface.

At least one of the first surface and the second surface is a concave-convex surface. Each of the first surface and the second surface is a concave-convex surface, and a concave part of the second surface is embedded in a concave part of the first surface.

The concave-convex surface includes a plurality of concave parts arranged in an array.

The concave part of the concave-convex surface has a shape selected from any one or combination of rectangle, arc and triangle.

The concave part of the concave-convex surface has a width in the range of 3 to 200 µm; the concave part of the concave-convex surface has a depth in the range of 0.5 to 5 µm; and a distance between two adjacent concave parts of the concave-convex surface is in the range of 3 to 200 µm.

The isolation layer includes an inorganic material.

The isolation layer includes one of a silicon oxide film layer, a silicon nitride film layer, and a composite film layer of a silicon oxide film layer and a silicon nitride film layer.

A surface of the first flexible layer facing away from the isolation layer includes a flat surface, and/or a surface of the second flexible layer facing away from the isolation layer includes a flat surface.

Each of the first flexible layer and the second flexible layer includes a polyimide material.

In a second aspect, an embodiment of the present disclosure provides a display panel, including the above flexible base substrate.

The edge region includes a cutting region and/or a bonding region. A driving assembly and a light-emitting device are formed on a surface of the second flexible layer on the flexible base substrate facing away from the isolation layer; and the layer where the light-emitting device is located is covered with a package layer.

Reference Signs: 1. flexible base substrate; 11. first flexible layer; 12. second flexible layer; 13. isolation layer; 2. driving device layer; 3. light-emitting device layer; and 4. package layer.

DETAILED DESCRIPTION OF THE EMBODIMENTS

To improve understanding of the technical solution of the present disclosure for those skilled in the art, the present disclosure will now be described in detail with the help of accompanying drawings and specific implementations.

Unless otherwise defined, technical or scientific terms used in the present disclosure are intended to have general meanings as understood by those of ordinary skill in the art. The words "first", "second" and similar terms used in the present disclosure do not denote any order, quantity, or importance, but are used merely for distinguishing different components. Also, the use of the terms "a", "an", or "the" and similar referents do not denote a limitation of quantity, but rather denote the presence of at least one. The word "comprising" or "comprises" or the like means that the element or item preceding the word includes elements or items that appear after the word or equivalents thereof, but does not exclude other elements or items. The terms "connected" or "coupled" and the like are not restricted to physical or mechanical connections, but may include electrical connections, either direct or indirect. The words "upper", "lower", "left", "right", or the like are merely used to indicate a relative positional relation, and when an absolute position of the described object is changed, the relative positional relationship may also be changed accordingly.

Figure 1:
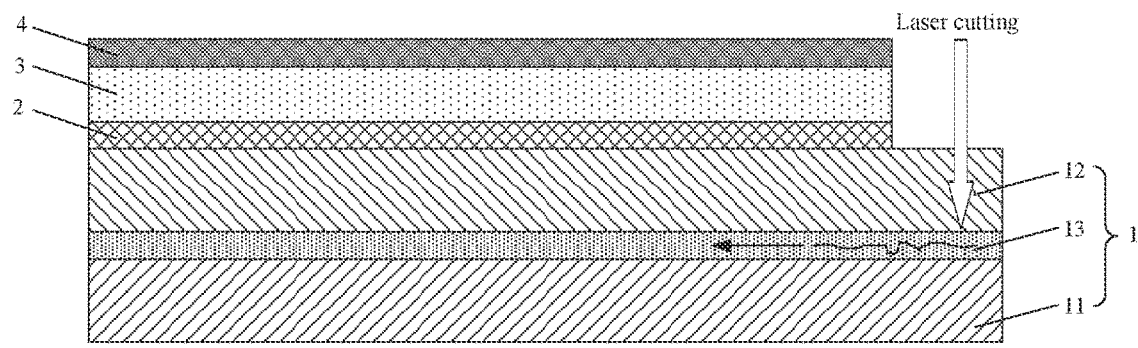
FIG. 1 is a schematic diagram of a conventional organic electroluminescent display panel.

FIG. 1 illustrates the structure of an Organic Light-Emitting Diode (OLED) display panel, which includes a flexible base substrate 1, and a driving device layer 2, a light-emitting device layer 3, and a package layer 4 sequentially disposed on the flexible base substrate 1. The flexible base substrate 1 includes: a first flexible layer 11, an isolation layer 13 and a second flexible layer 12 arranged in a laminated manner. The first flexible layer 11 and the second flexible layer 12 are generally made of the same material, in particular polyimide. The isolation layer 13 is typically made of an inorganic material. Specifically, the isolation layer 13 may consist of a single film layer structure of a silicon oxide film layer or a silicon nitride film layer, or may consist of a composite film layer structure of a silicon oxide film layer and a silicon nitride film layer. Each of the first flexible layer 11, the second flexible layer 12, and the isolation layer 13 is a flat layer structure.

The inventor has found that after the package layer 4 is formed, cracks are easy to generate on the isolation layer 13 at a position of cutting line when the display panel is cut by a laser cutting process, and prone to extend in the horizontal direction due to the flat surface of the isolation layer 13. As a result, water and harmful gases such as oxygen may easily permeate into the OLED device along the cracks and thus damage the OLED device. Likewise, after the display panel is formed, cracks are also easy to generate on the isolation layer 13 when the display panel is bent, causing water and harmful gases such as oxygen to permeate into the OLED device along the cracks and thus damage the OLED device.

In view of the above problems, the following embodiments are provided in the present disclosure.

In a first aspect, as shown in FIGS. 2 to 5, an embodiment of the present disclosure provides a flexible base substrate, including at least one substrate unit each having a middle region and an edge region; wherein the flexible base substrate includes: a first flexible layer, a second flexible layer, and an isolation layer disposed between the first flexible layer and the second flexible layer; the isolation layer includes a first surface in contact with the first flexible layer, and a second surface in contact with the second flexible layer; and wherein at least one of the first surface and the second surface has a segment difference on two sides of a junction between the middle region and the edge region.

It should be noted here that the middle region of the substrate unit refers to a region in which a driving element, an OLED device, or other display elements are formed during formation of the display panel; and the edge region refers to a region in which a connection pad is formed for bonding during formation of the display panel, and which is bent to a side of the flexible base substrate facing away from the OLED device after the bonding process is completed, and may further include a cutting region when the flexible base substrate is cut.

In the embodiment of the disclosure, since one of the first surface and the second surface of the isolation layer has a segment difference on two sides of a junction between the middle region and the edge region, if the edge region is a cutting region, and cutting is performed on the side of the flexible base substrate with the segment difference, even if a crack is generated, the crack will extend along the horizontal direction instead of toward the adjacent middle region. Therefore, the problem of water and harmful gases such as oxygen permeating into the OLED device along the crack and thus damaging the OLED device caused by the crack on the isolation layer is greatly alleviated. Similarly, if the edge region includes a bonding region, even if a crack occurs when the flexible base substrate is bent, the crack will extend along the horizontal direction but not to the adjacent middle region due to the segment difference.

In some embodiments, the junction between the middle region and the edge region of the isolation layer is a position of the cutting line when the display panel is formed, and the position has a segment difference. That is, the first surface and the second surface of the isolation layer have a segment difference at the junction between the middle region and the edge region, so as to reduce the crack generated by cutting extending to the middle region as much as possible.

Figure 3:
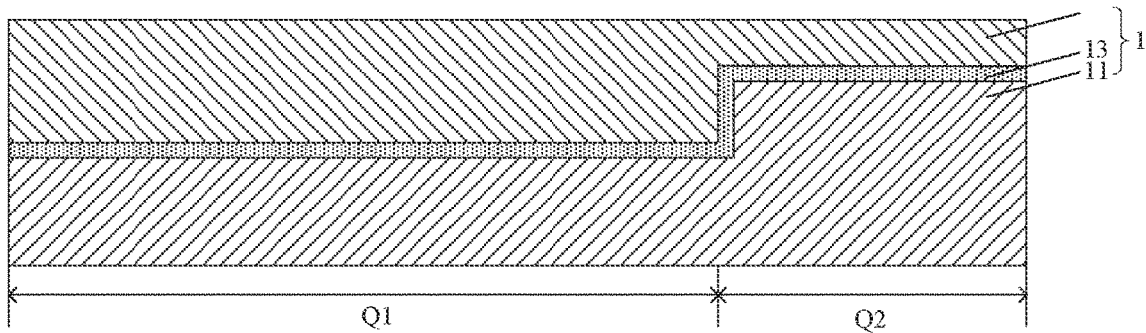
FIG. 3 is a schematic diagram of another flexible base substrate according to an embodiment of the disclosure.

Specifically, as shown in FIG. 3, a surface of the first flexible layer facing away from the isolation layer is taken as a reference plane, and at this time, both the first surface and the second surface protrude from the middle region in the edge region. Alternatively, as shown in FIG. 4. both the first surface and the second surface protrude from the edge region in the middle region.

Figure 4:
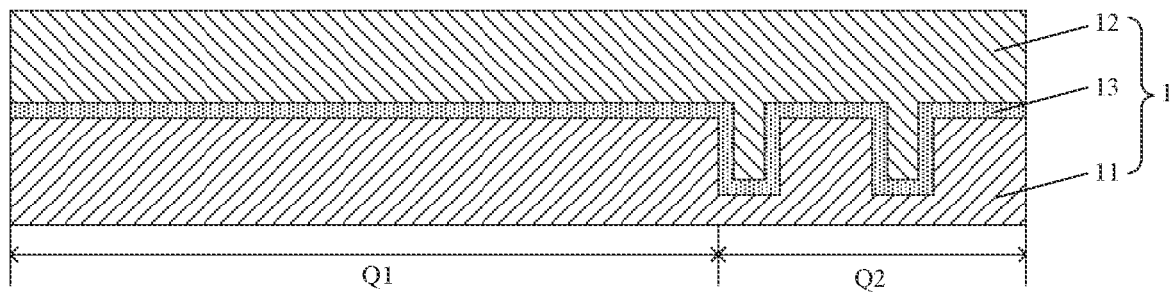
FIG. 4 is a schematic diagram of another flexible base substrate according to an embodiment of the disclosure.
Figure 5:
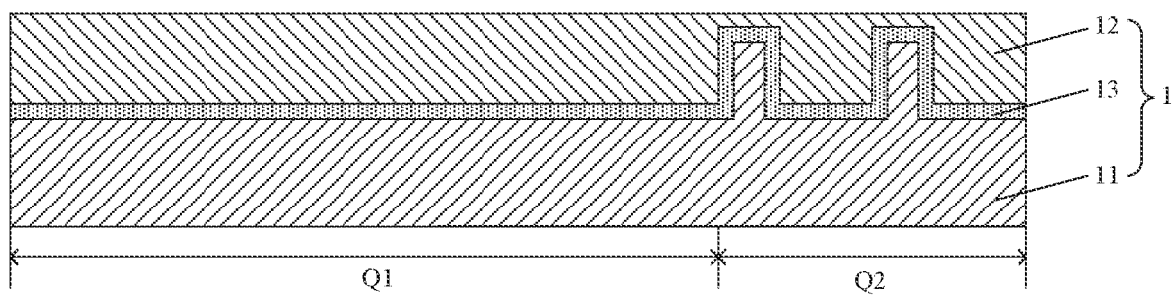
FIG. 5 is a schematic diagram of another flexible base substrate according to an embodiment of the disclosure.

In some embodiments, as shown in FIG. 4. the junction between the middle region and the edge region of the isolation layer is a position of the cutting line and/or the bonding region when the display panel is formed. In the edge region, each of the first surface and the second surface of the isolation layer is a concave-convex surface, and a concave part of the second surface is embedded in a concave part of the first surface. Apparently, as shown in FIG. 5, a convex part of the first surface is embedded in a convex part of the second surface.

Figure 6:
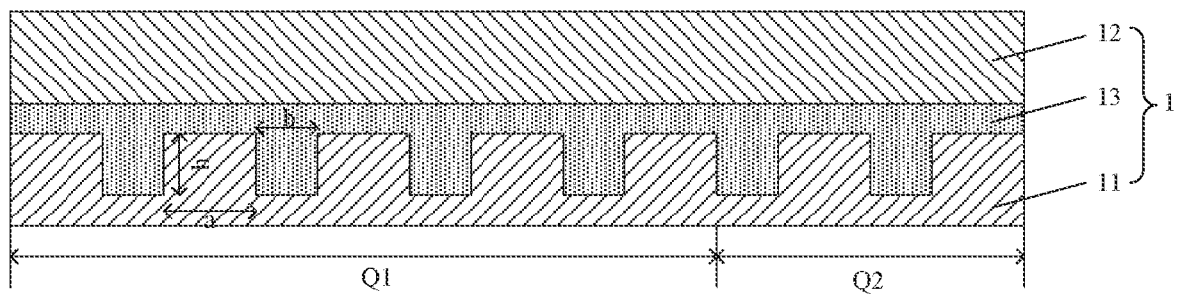
FIG. 6 is a schematic diagram of another flexible base substrate according to an embodiment of the disclosure.
Figure 7:
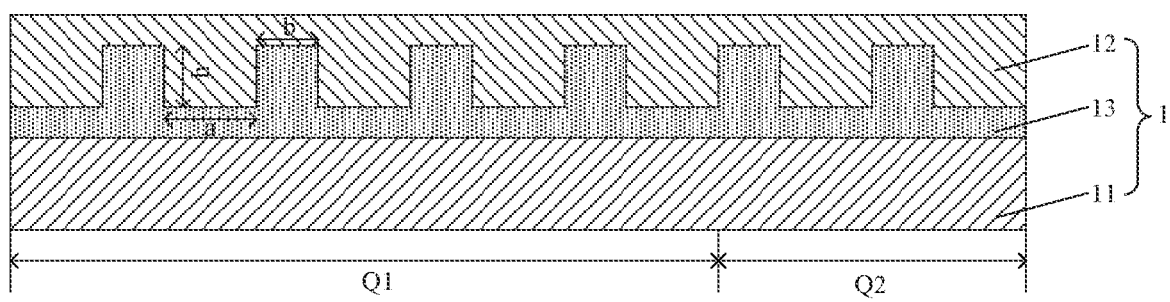
FIG. 7 is a schematic diagram of another flexible base substrate according to an embodiment of the disclosure.
Figure 8:
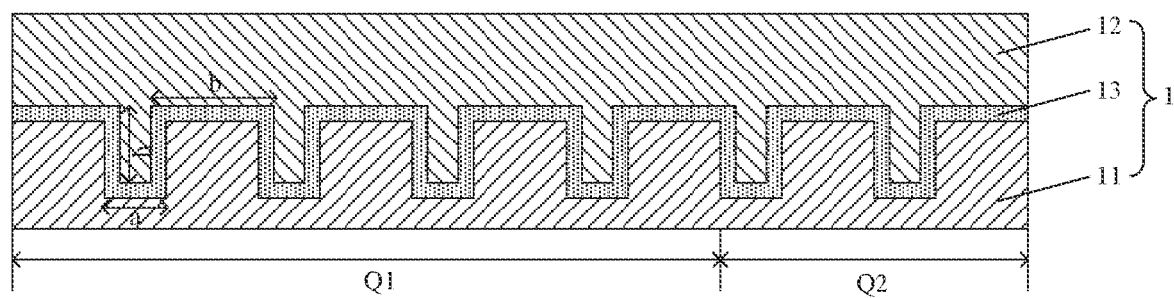
FIG. 8 is a schematic diagram of another flexible base substrate according to an embodiment of the disclosure.

Since in the edge region of the flexible base substrate provided by the embodiment of the disclosure, each of the first surface and the second surface of the isolation layer is a concave-convex surface, when cutting is performed on the concave-convex surface of the flexible base substrate, if the cutting line corresponds to the convex part of the concave-convex surface, even if a crack is generated, the crack will not extend toward the concave part because the crack extends along the horizontal direction and for the concave-convex surface, the convex part is adjacent to the concave part. Likewise, if the cutting line corresponds to the concave part of the concave-convex surface, the crack will not extend toward the adjacent convex part. Therefore, the problem of water and harmful gases such as oxygen permeating into the OLED device along the crack and thus damaging the OLED device caused by the crack on the isolation layer is greatly alleviated. Similarly, when the flexible base substrate is bent, even if a crack occurs in the concave part, the crack will extend toward the adjacent convex part, and a crack in the convex part will not extend toward the adjacent concave part. In some embodiments, as shown in FIGS. 6 to 8, an embodiment of the present disclosure provides a flexible base substrate 1, including a first flexible layer 11, a second flexible layer 12, and an isolation layer 13 disposed between the first flexible layer 11 and the second flexible layer 12. The isolation layer 13 has a first surface in contact with the first flexible layer 11, and a second surface in contact with the second flexible layer 12. At least one of the first surface and the second surface is a concave-convex surface.

Figure 2:
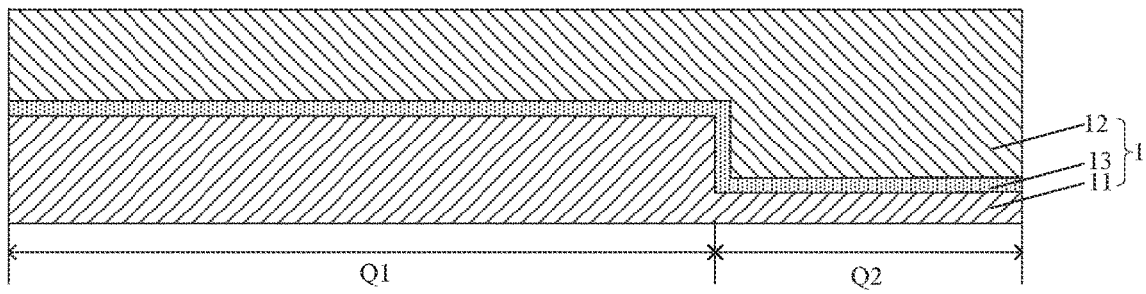
FIG. 2 is a schematic diagram of a flexible base substrate according to an embodiment of the disclosure.

It should be noted here that the concave-convex surface includes a concave part and a convex part. In the embodiments of the present disclosure, the concave part and the convex part are divided by taking a surface of the second flexible layer 12 facing away from the isolation layer 13 as a reference surface. As shown in FIGS. 2 to 4, two adjacent convex parts define a concave part.

In the embodiment of the disclosure, since at least one of the first surface and the second surface of the isolation layer 13 on the flexible base substrate 1 is a concave-convex surface, when cutting is performed on a side of the flexible base substrate 1 closer to the concave-convex surface, if the cutting line corresponds to the convex part of the concave-convex surface, even if a crack is generated, the crack will not extend toward the concave part because the crack extends along the horizontal direction and for the concave-convex surface, the convex part is adjacent to the concave part. Likewise, if the cutting line corresponds to the concave part of the concave-convex surface, the crack will not extend toward the adjacent convex part. Therefore, the problem of water and harmful gases such as oxygen permeating into the OLED device along the crack and thus damaging the OLED device caused by the crack on the isolation layer 13 is greatly alleviated. Similarly, when the flexible base substrate 1 is bent, even if a crack occurs in the concave part, the crack will extend toward the adjacent convex part, and a crack in the convex part will not extend toward the adjacent concave part.

In some embodiments, the concave part on the concave-convex surface of the isolation layer 13 has a shape including, but not limited to, any one or combination of rectangle, arc and triangle. In the following embodiments, a concave part having a rectangular shape is taken as an example for explanation.

First example: as shown in FIG. 6, the surface of the first flexible layer 11 facing away from the isolation layer 13 is a flat surface, and the surface of the first flexible layer 11 closer to the isolation layer 13 is a concave-convex surface. The first surface of the isolation layer 13 is a concave-convex surface, the concave part of the first surface is embedded in the concave part of the first flexible layer 11, and the second surface of the isolation layer 13 is a flat surface. The surfaces of the second flexible layer 12 closer to the isolation layer 13 and facing away from the isolation layer 13 are both flat surfaces.

In some embodiments, a concave part width a of the first surface is in the range of, but not limiting to, 3 to 200 μm; a convex part width b, i.e., a distance between adjacent concave parts, is in the range of 3 to 200 μm; and a concave part depth h is in the range of 0.5 to 5 μm. The specific values of a, b and h may be specifically defined according to a thickness value of the flexible base substrate 1.

In some embodiments, the isolation layer 13 may be a single film layer structure or a composite structure of multiple film layers. When the isolation layer 13 is a single film layer structure, the material thereof may include silicon oxide or silicon nitride. When the isolation layer 13 is a composite structure, it may have a laminated structure in which a silicon oxide film layer and a silicon nitride film layer are alternately disposed.

In some embodiments, the material of the first flexible layer 11 and the second flexible layer 12 includes, but is not limited to, polyimide.

With respect to the flexible base substrate 1, a method for manufacturing the flexible base substrate 1 is further provided in this example, which specifically includes the following steps S11 to S13.

At S11, forming a first flexible material layer, and exposing, developing and etching the first flexible material layer to form a first flexible layer 11 with a plurality of recesses, wherein one surface of the formed first flexible layer 11 is a flat surface, and the other surface is a concave-convex surface.

At S12, forming an isolation layer 13 on the concave-convex surface of the first flexible layer 11 so that a surface of the isolation layer 13 in contact with the first flexible layer 11, i.e., a first surface of the isolation layer 13, is a concave-convex surface adapted to the concave-convex surface of the first flexible layer 11. and a surface of the isolation layer 13 facing away from the first flexible layer 11, i.e., a second surface of the isolation layer 13, is a flat surface.

At S13, forming a second flexible layer 12 on the second surface of the isolation layer 13.

Second example: as shown in FIG. 7, the surfaces of the first flexible layer 11 closer to the isolation layer 13 and facing away from the isolation layer 13 are both flat surfaces. The first surface of the isolation layer 13 is a flat surface, and the second surface is a concave-convex surface. A surface of the second flexible layer 12 closer to the isolation layer 13 is a concave-convex surface, a concave part of the second flexible layer 12 is embedded in a concave part of the isolation layer 13, and the surface of the second flexible layer 12 facing away from the isolation layer 13 is a flat surface.

In some embodiments, a concave part width a of the second surface is in the range of, but not limiting to, 3 to 200 μm; a convex part width b, i.e., a distance between adjacent concave parts. is in the range of 3 to 200 μm; and a concave part depth h is in the range of 0.5 to 5 μm. The specific values of a, b and h may be specifically defined according to a thickness value of the flexible base substrate 1.

The materials of the isolation layer 13, the first flexible layer 11, and the second flexible layer 12 are the same as the above example, and thus are not repeated here.

With respect to the flexible base substrate 1, a method for manufacturing the flexible base substrate 1 is further provided in this example, which specifically includes the following steps S21 to S23.

At S21, forming a first flexible layer 11, wherein two opposite surfaces of the first flexible layer 11 are both flat surfaces.

At S22, forming an isolation material layer on the first flexible layer 11, and forming an isolation layer 13 having a plurality of recesses by exposure, development and etching, wherein a surface of the formed isolation layer 13 closer to the first flexible layer 11, i.e., a first surface, is a flat surface, and a surface thereof facing away from the first flexible layer 11, i.e., a second surface, is a concave-convex surface.

At S23, forming a second flexible layer 12 on the second surface of the isolation layer 13, wherein a surface of the second flexible layer 12 closer to the isolation layer 13 is in contact with the second surface of the isolation layer 13, i.e., the surface is a concave-convex surface, and a surface thereof facing away from the isolation layer 13 is a flat surface.

Third example: as shown in FIG. 8, the surface of the first flexible layer 11 facing away from the isolation layer 13 is a flat surface, and the surface of the first flexible layer 11 closer to the isolation layer 13 is a concave-convex surface. The first surface of the isolation layer 13 is a concave-convex surface, the concave part of the first surface is embedded in the concave part of the first flexible layer 11, and the second surface of the isolation layer 13 is also a concave-convex surface and a concave part of the second surface is embedded in a concave part of the first surface. A surface of the second flexible layer 12 closer to the isolation layer 13 is in contact with the second surface of the isolation layer 13, i.e., the surface is a concave-convex surface, and a surface thereof facing away from the isolation layer 13 is a flat surface.

It can be seen that the concave parts on the second surface of the isolation layer 13 are disposed in one-to-one correspondence with the concave parts on the first surface, the concave parts of the second surface are embedded in the concave parts of the first surface, and the convex parts of the first surface are embedded in the convex parts of the second surface. That is, the concave part width of the second surface is smaller than the concave part width of the corresponding first surface; and the convex part width of the second surface is larger than the convex part width of the corresponding first surface. In this case, the isolation layer 13 has a concave-convex structure.

In some embodiments, each concave part of the concave-convex structure has a width a ranges from 3 μm to 200 μm; each convex part of the concave-convex structure has a width b, i.e., a distance between adjacent concave parts, ranges from 3 to 200 μm; and each concave part has a depth h ranges from 0.5 μm to 5 μm. The specific values of a, b and h may be specifically defined according to a thickness value of the flexible base substrate 1.

The materials of the isolation layer 13, the first flexible layer 11, and the second flexible layer 12 are the same as the above example, and thus are not repeated here. With respect to the flexible base substrate 1, a method for manufacturing the flexible base substrate 1 is further provided in this example, which specifically includes the following steps S31 to S33.

At step S31, forming a first flexible material layer, and exposing, developing and etching the first flexible material layer to form a first flexible layer 1I with a plurality of recesses, wherein one surface of the formed first flexible layer 11 is a flat surface, and the other surface is a concave-convex surface.

At S32, forming an isolation layer 13 on the concave-convex surface of the first flexible layer 11 so that a surface of the isolation layer 13 in contact with the first flexible layer 11, i.e., a first surface of the isolation layer 13. is a concave-convex surface adapted to the concave-convex surface of the first flexible layer 11, and a surface of the isolation layer 13 facing away from the first flexible layer 11, i.e., a second surface of the isolation layer 13, is also a concave-convex surface.

At S33, forming a second flexible layer 12 on the second surface of the isolation layer 13, wherein a surface of the second flexible layer 12 closer to the isolation layer 13 is in contact with the second surface of the isolation layer 13, i.e., the surface is a concave-convex surface, and a surface thereof facing away from the isolation layer 13 is a flat surface.

Figure 9:
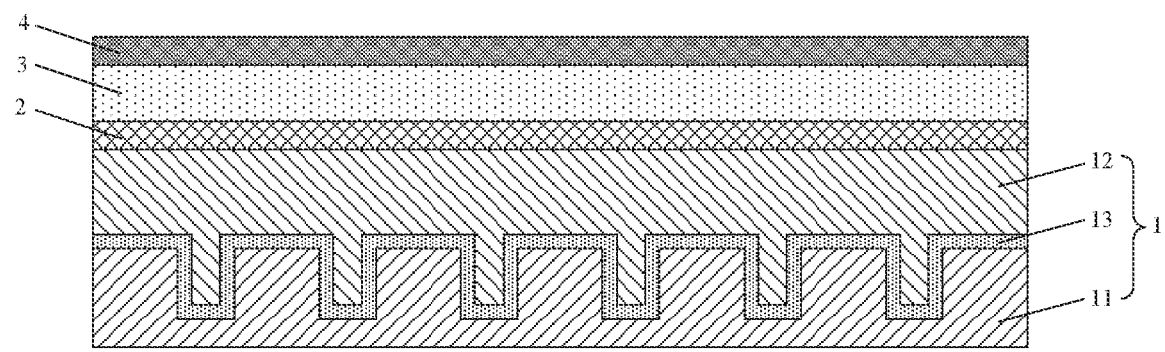
FIG. 9 is a schematic diagram of a display panel according to an embodiment of the disclosure.

In a second aspect, as shown in FIG. 9, an embodiment of the present disclosure provides a display panel, including the above flexible base substrate 1.

Since the display panel in the embodiment of the disclosure includes the flexible base substrate 1 as describe above, and at least one of the first surface and the second surface of the isolation layer 13 on the flexible base substrate 1 is a concave-convex surface, when cutting is performed on a side of the flexible base substrate 1 closer to the concave-convex surface, if the cutting line corresponds to the convex part of the concave-convex surface, even if a crack is generated, the crack will not extend toward the concave part because the crack extends along the horizontal direction and for the concave-convex surface, the convex part is adjacent to the concave part. Likewise, if the cutting line corresponds to the concave part of the concave-convex surface, the crack will not extend toward the adjacent convex part. Therefore, the problem of water and harmful gases such as oxygen permeating into the OLED device along the crack and thus damaging the OLED device caused by the crack on the isolation layer 13 is greatly alleviated. Similarly. when the flexible base substrate 1 is bent, even if a crack occurs in the concave part, the crack will extend toward the adjacent convex part, and a crack in the convex part will not extend toward the adjacent concave part. Thus, the display panel of the embodiment of the disclosure has higher yield In some embodiments, a driving assembly layer 2 (including a thin film transistor, a storage capacitor, and other structures) and a light-emitting device layer 3 are formed on a surface of the second flexible layer 12 of the flexible base substrate 1 facing away from the barrier layer; and the light-emitting device layer is covered with a package layer 4. Specifically, the light-emitting device in the light-emitting device layer may be an OLED device. Apparently, a backing film is further formed on a side of the first flexible layer 11 of the flexible base substrate 1 facing away from the isolation layer 13.

In a third aspect, an embodiment of the present disclosure provides a display device including the display panel as described above.

The display device in this embodiment may be an electronic paper, an OLED panel, a mobile phone, a tablet, a television, a monitor, a laptop, a digital album, a navigator or any other product or component having a display function.

It will be appreciated that the above implementations are merely exemplary implementations for the purpose of illustrating the principle of the disclosure, and the disclosure is not limited thereto. It will be apparent to those skilled in the art that various modifications and variations can be made to the disclosure without departing from the spirit or essence of the disclosure. Such modifications and variations should also be considered as falling into the protection scope of the disclosure.

What is claimed is:

1. A flexible base substrate, comprising at least one substrate unit each having a middle region and an edge region; wherein the flexible base substrate comprises: a first flexible layer, a second flexible layer, and an isolation layer disposed between the first flexible layer and the second flexible layer; the isolation layer comprises a first surface in contact with the first flexible layer, and a second surface in contact with the second flexible layer; and
    parts of the isolation layer in the middle region and the edge region are both flat structures, and the isolation layer has a segment difference at only a junction between the middle region and the edge region.

2. The flexible base substrate according to claim 1, wherein the isolation layer comprises an inorganic material.

3. The flexible base substrate according to claim 1, wherein the isolation layer comprises one of a silicon oxide film layer, a silicon nitride film layer, and a composite film layer of a silicon oxide film layer and a silicon nitride film layer.

4. The flexible base substrate according to claim 1, wherein each of the first flexible layer and the second flexible layer comprises a polyimide material.

5. A display panel, comprising the flexible base substrate according to claim 1.

6. The display panel according to claim 5, wherein the edge region comprises a cutting region and/or a bonding region.

7. The display panel according to claim 5, wherein a driving assembly and a light-emitting device are formed on a surface of the second flexible layer on the flexible base substrate facing away from the isolation layer; and the layer where the light-emitting device is located is covered with a package layer.

\* \* \* \* \*